US012644044B2

(12) United States Patent
Zhang et al.

(10) Patent No.: US 12,644,044 B2
(45) Date of Patent: Jun. 2, 2026

(54) QUANTUM DOT FILM AND PREPARATION METHOD THEREOF, AND QUANTUM DOT LIGHT-EMITTING DIODE AND PREPARATION METHOD THEREOF

(71) Applicant: TCL TECHNOLOGY GROUP CORPORATION, Huizhou (CN)

(72) Inventors: Xuanyu Zhang, Huizhou (CN); Wenyong Liu, Huizhou (CN)

(73) Assignee: TCL TECHNOLOGY GROUP CORPORATION, Huizhou (CN)

( * ) Notice: Subject to any disclaimer, the term of this patent is extended or adjusted under 35 U.S.C. 154(b) by 1008 days.

(21) Appl. No.: 17/853,916

(22) Filed: Jun. 30, 2022

(65) Prior Publication Data

US 2022/0376197 A1 Nov. 24, 2022

Related U.S. Application Data

(63) Continuation of application No. PCT/CN2020/139378, filed on Dec. 25, 2020.

(30) Foreign Application Priority Data

Jun. 24, 2020 (CN) ........................ 202010591366.6

(51) Int. Cl.
*C09K 11/02* (2006.01)
*B82Y 20/00* (2011.01)
(Continued)

(52) U.S. Cl.
CPC ................. *C09K 11/02* (2013.01); *C08J 5/18* (2013.01); *H10K 50/115* (2023.02); *H10K 71/00* (2023.02);
(Continued)

(58) Field of Classification Search
CPC ........... C09K 11/02; C08J 5/18; H10K 71/00; H10K 50/115; H10K 71/10
See application file for complete search history.

(56) References Cited

U.S. PATENT DOCUMENTS

2017/0158954 A1 6/2017 Yang et al.

FOREIGN PATENT DOCUMENTS

CN 103772872 A 5/2014
CN 105070849 A * 11/2015 ............ H10K 71/12
(Continued)

OTHER PUBLICATIONS

International search report of PCT Patent Application No. PCT/CN2020/139378 issued on Apr. 1, 2021.

*Primary Examiner* — Antonio B Crite

(57) ABSTRACT

A method for preparing a quantum dot film, including: in the presence of an inert gas atmosphere, providing a mixed solution system comprising first quantum dots and a fatty acid solution of first ligands, and performing ligand exchange reaction under a first heating condition, to prepare second quantum dots having the first ligands having a structure of Formula 1 attached to surfaces thereof; and depositing the second quantum dots on a substrate to prepare a quantum dot prefabricated film, depositing a mixed solution containing an initiator and a cross-linker on the quantum dot prefabricated film, and heating to crosslink the first ligands on the surfaces of the second quantum dots; or alternatively, adding an initiator and a cross-linker to the second quantum dots, and depositing a resulting mixed system onto a substrate, heating to crosslink the first ligands on the surfaces of the second quantum dots.

19 Claims, 2 Drawing Sheets

(51) Int. Cl.

| | |
|---|---|
| ***B82Y 30/00*** | (2011.01) |
| ***B82Y 40/00*** | (2011.01) |
| ***C08J 5/18*** | (2006.01) |
| ***C08K 3/30*** | (2006.01) |
| ***C08L 33/10*** | (2006.01) |
| ***C09K 11/56*** | (2006.01) |
| ***C09K 11/88*** | (2006.01) |
| ***H10K 50/115*** | (2023.01) |
| ***H10K 71/00*** | (2023.01) |
| ***H10K 85/00*** | (2023.01) |

(52) U.S. Cl.
CPC .............. *H10K 85/00* (2023.02); *B82Y 30/00* (2013.01); *B82Y 40/00* (2013.01)

(56) References Cited

FOREIGN PATENT DOCUMENTS

| | | | |
|---|---|---|---|
| CN | 107966878 | A | 4/2018 |
| CN | 108242482 | A | 7/2018 |
| CN | 109378395 | A | 2/2019 |
| CN | 109935710 | A | 6/2019 |
| CN | 109935715 | A | 6/2019 |
| CN | 109935724 | A | 6/2019 |
| CN | 110028948 | A | 7/2019 |
| WO | 2020063256 | A1 | 4/2020 |

* cited by examiner

QUANTUM DOT FILM AND PREPARATION METHOD THEREOF, AND QUANTUM DOT LIGHT-EMITTING DIODE AND PREPARATION METHOD THEREOF

CROSS-REFERENCE TO RELATED APPLICATIONS

This application is a continuation application of International Patent Application No. PCT/CN2020/139378 with an international filing date of Dec. 25, 2020, designating the United States, now pending, which is based on Chinese Patent Application No. 202010591366.6 filed Jun. 24, 2020. The contents of all of the aforementioned applications, including any intervening amendments thereto, are incorporated herein by reference.

BACKGROUND

Technical Field

The present application relates to the field of display technology, in particular to a quantum dot film and a preparation method thereof, as well as a quantum dot light-emitting diode and a preparation method thereof.

Description of the Related Art

Quantum dots, also known as semiconductor nanocrystals, are usually composed of II-VI or III-V elements, and have particle sizes smaller than or close to an exciton Bohr radius. After nearly 30 years of research and development, significant breakthroughs have been made in the development of quantum dot synthesis technology. The research on II-VI quantum dots represented by CdSe has become more and more perfect. For example, the photoluminous efficiency is close to 100%, a peak width is as narrow as 20-30 nm, and the device efficiency and device lifespan of red and green quantum dots almost satisfy the requirements of commercial applications. Since being synthesized by a total solution method, the high-quality quantum dots are very suitable for the preparation of films by solution processing methods such as spin coating and printing. Therefore, QLED having quantum dots as the light-emitting layer is expected to become a strong competitor for the next generation of new display technologies.

However, the electroluminescent devices of quantum dots still have problems such as low efficiency and short lifespan, and the spin-coating technology commonly used to construct high-efficiency QLED devices usually uses ZnO as the electron transport layer (ETL) of QLEDs. However, due to the non-polarity of the surface of the quantum dots and poor contact with ZnO, the electron injection is difficult, the surface structure of the quantum dots is chaotic, the superlattice structure of the quantum dot layer is incomplete, and has many defects and low order degree, which makes the quantum dot film has poor electrical properties, and electron mobility of the device is much higher than the hole mobility, which makes the charge accumulation phenomenon at the QD/ETL interface very serious, and has a very adverse effect on the efficiency and life of the QLED device.

In view of the shortcomings of the above technologies, by introducing special ligands (such as hydroxyethyl methacrylate) in the synthesis process and combining with the QLED-based solution preparation technology, the quantum dots and quantum dot films can be surface-treated before and after the film formation. For the quantum dot film prepared by the solution method, the catalyst configured for the ligand reaction can be incorporated after the film formation, and the states of the quantum dots are converted by the ligand reaction after the film formation, so as to improve the electrical performance of the quantum dot film.

SUMMARY

It is one of objectives of embodiments of the present application to provide a quantum dot film and a preparation method thereof, as well as a quantum dot light-emitting diode and a preparation method thereof, which aim at solving the problems of loose lattice structure and various film defects existing in the quantum dot films.

Technical solutions adopted by embodiments of the present application are as follows:

In a first aspect, a quantum dot film is provided. The quantum dot film is composed of quantum dots. Each of the quantum dots comprises a quantum dot matrix and ligands attached to a surface of the quantum dot matrix. Each of the ligands comprises a first ligand having a structure formula as represented by Formula 1, Formula 1

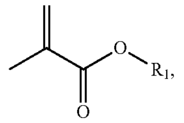

in which, $R_1$ is selected from a substitute containing between one and six carbon atoms and having a first active group at a terminal; and the first ligands are crosslinked with one another via polymerization reaction of double bonds to form a network structure.

In a second aspect, a method for preparing a quantum dot film is provided. The method comprises the following steps:

in the presence of an inert gas atmosphere, providing a mixed solution system comprising first quantum dots and a fatty acid solution of first ligands, and performing ligand exchange reaction under a first heating condition, to prepare second quantum dots having the first ligands attached to surfaces thereof; in which, each of the first ligands has a structure formula as represented by Formula 1, Formula 1

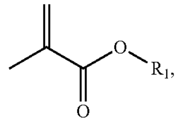

in which, $R_1$ is selected from a substitute containing between one and six carbon atoms and having a first active group at a terminal; and providing a substrate, depositing the second quantum dots on the substrate to prepare a quantum dot prefabricated film, depositing a mixed solution containing an initiator and a cross-linker on the quantum dot prefabricated film, and heating to crosslink the first ligands on the surfaces of the second quantum dots, to obtain the quantum dot film; or alternatively, providing a substrate, adding an initiator and a cross-linker to the second quantum dots, and depositing a resulting mixed system onto the substrate, heating to crosslink the first ligands on the surfaces of the second quantum dots, to obtain the quantum dot film.

In a third aspect, a quantum dot light-emitting diode is provided. The quantum dot light-emitting diode comprises: an anode and a cathode that are arranged oppositely, and a quantum dot light-emitting layer arranged between the cathode and the anode. The quantum dot light-emitting layer is the quantum dot film as described in the above. Or alternatively, the quantum dot light-emitting layer is the quantum dot film as described in the above.

In a fourth, a method for preparing a quantum dot light-emitting diode is provided. The method at least comprises: preparing a quantum dot light-emitting layer. The quantum dot light-emitting layer is prepared by the method as described in the above.

In the quantum dot film provided in embodiments of the present application, first ligands containing double bonds are introduced into the quantum dots before the film formation. After the quantum dots are formed into a film by a solution method, a catalyst configured to promote the polymerization of the first ligands is added into the film. The quantum dot film is performed with surface treatment to polymerize the first ligands to form a network structure, and the quantum dots are ordered and stabilized in the polymerization network to improve the electrical properties of the quantum dot film. In such case, through the polymerization network among the first ligands, the first ligands of different quantum dots are connected, so that the distance between the quantum dots is reduced, the tunneling effect of the charges is enhanced. Moreover, the formed polymerization network has a certain conjugated conductive ability; therefore, the radiation transition ability and the carrier migration ability of the quantum dot film are enhanced. Meanwhile, the polymerization reaction between the first ligands improves the order degree of the quantum dot film, which modifies the grain boundaries in the superlattice, reduces grain boundary defects, improves the crystallinity of the film, and therefore enhances the carrier mobility of quantum dot film.

In the method for preparing the quantum dot film provided in embodiments of the present application, first ligands are bound onto the surfaces of the quantum dots, and the first ligands contain double bonds. Under the catalysis of the initiator and the cross-linker, the polymerization reaction between the first ligands on the surfaces of the quantum dots is initiated, so that the first ligands form the polymerization network between the quantum dots. In such case, through the polymerization network among the first ligands, the first ligands of different quantum dots are connected, so that the distance between the quantum dots is reduced, the tunneling effect of the charges is enhanced. Moreover, the formed polymerization network has a certain conjugated conductive ability; therefore, the radiation transition ability and the carrier migration ability of the quantum dot film are enhanced. Meanwhile, the polymerization reaction between the first ligands improves the order degree of the quantum dot film, which modifies the grain boundaries in the superlattice, reduces grain boundary defects, improves the crystallinity of the film, and therefore enhances the carrier mobility of quantum dot film.

The quantum dot light-emitting diodes provided in embodiments of the present application use the above-mentioned quantum dot light-emitting film as the quantum dot light-emitting diode, so that the service life and luminous efficiency of the quantum dot light-emitting diodes can be improved, which has great significance for realizing a high-quality multilayer combined film structure.

The method for preparing the quantum dot light-emitting diode provided in embodiments of the present application can effectively reduce the non-radiative transition caused by the defects of the crystal grain interface of the quantum dots, shorten the quantum dot spacing, and improve the density of the quantum dot film, thereby improving the radiation transition ability and the carrier mobility of the light emitting layer in the film, and ultimately improving the luminous efficiency and service life of quantum dot light-emitting diode devices.

BRIEF DESCRIPTION OF THE DRAWINGS

In order to illustrate the technical solutions in embodiments of the present application more clearly, accompanying drawings that are used in the description of the embodiments or exemplary technologies are briefly introduced hereinbelow. Obviously, the drawings in the following description are only some embodiments of the present application. For those skilled in the art, other drawings can also be obtained according to these drawings without any creative effort.

DETAILED DESCRIPTION OF THE EMBODIMENTS

Figure 1:
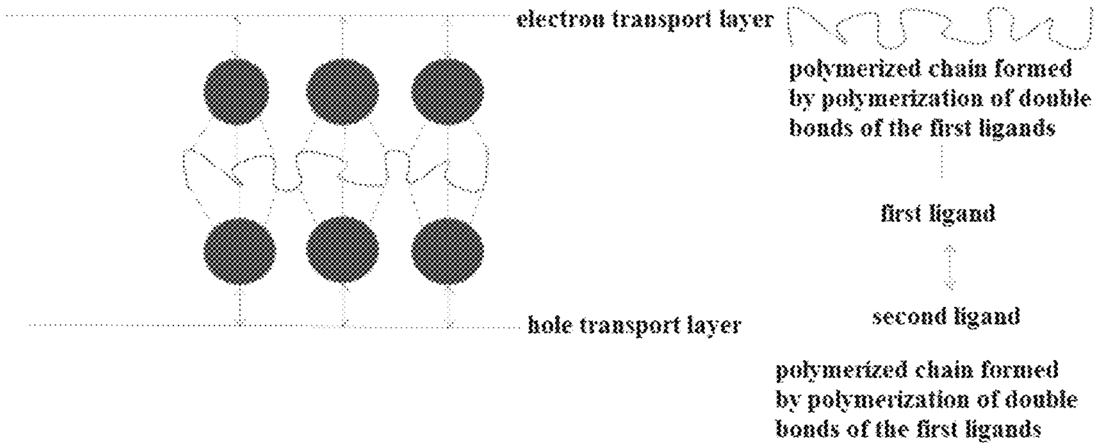
FIG. 1 is a schematic diagram of a quantum dot film after film formation of quantum dots having both the first ligands and the second ligands attached to surfaces thereof, and interfaces between the quantum dot film and the hole transport layer, and between the quantum dot film and the electron transport layer.

In order to make the purpose, technical solutions, and advantages of the present application more clearly understood, the present application will be described in further detail hereinbelow with reference to the accompanying drawings and embodiments. It should be understood that the specific embodiments described herein are only used to explain the present application, but not to limit the present application.

In the description of the present application, it should be understood that the terms "first" and "second" are only used for description purposes, and cannot be interpreted as indicating or implying relative importance or implicitly indicating the number of indicated technical features. Thus, features defined as "first" or "second" may expressly or implicitly include one or more of such feature. In the description of the present application, "plurality" means two or more, unless otherwise expressly and specifically defined.

The weight of the relevant components mentioned in the description of the examples of the present application can not only refer to the specific content of each component, but also can represent the proportional relationship between the weights of the components. It is within the scope disclosed in the description of the embodiments of the present application that the content of the component is scaled up or down. Specifically, the weights described in the description of the embodiments of the present application may be weight units known in the chemical field, such as mg, g, and kg.

A first aspect of embodiments of the present application provides a quantum dot film. The quantum dot film is composed of quantum dots. Each of the quantum dots comprises a quantum dot matrix and ligands attached to a surface of the quantum dot matrix. Each of the ligands comprises a first ligand having a structure formula as represented by Formula 1, Formula 1

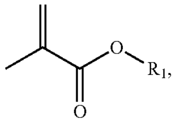

in which, $R_1$ is selected from a substitute containing between one and six carbon atoms and having a first active group at a terminal; and the first ligands are crosslinked with one another via polymerization reaction of double bonds to form a network structure.

In the quantum dot film provided in embodiments of the present application, first ligands containing double bonds are introduced into the quantum dots before the film formation. After the quantum dots are formed into a film by a solution method, a catalyst configured to promote the polymerization of the first ligands is added into the film. The quantum dot film is performed with surface treatment to polymerize the first ligands to form a network structure, and the quantum dots are ordered and stabilized in the polymerization network to improve the electrical properties of the quantum dot film. In such case, through the polymerization network among the first ligands, the first ligands of different quantum dots are connected, so that the distance between the quantum dots is reduced, the tunneling effect of the charges is enhanced. Moreover, the formed polymerization network has a certain conjugated conductive ability; therefore, the radiation transition ability and the carrier migration ability of the quantum dot film are enhanced. Meanwhile, the polymerization reaction between the first ligands improves the order degree of the quantum dot film, which modifies the grain boundaries in the superlattice, reduces grain boundary defects, improves the crystallinity of the film, and therefore enhances the carrier mobility of quantum dot film. In this way, the charge accumulation in the quantum dot light-emitting layer and the transport layer of the quantum dot light-emitting device is reduced, so that both the service life and the luminous efficiency of the quantum dot light-emitting device are improved, which has great significance for realizing a high-quality multilayer combined film structure.

In some embodiments of the present application, the quantum dot matrix refers to a quantum dot material not containing any ligands. Such quantum dot material may be a core-shell structure. In some embodiments, the core compound and the shell compound of the quantum dot matrix may be independently selected from, but not limited to, any one or any combination of: CdS, CdSe, CdTe, ZnS, ZnSe, ZnTe, ZnO, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, and HgZnSTe of the II-VI compounds; GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InNP, InNAs, InNSb, InPAs, InPSb, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb of the III-V compounds; and SnS, SnSe, SnTe, PbS, PbSe, PbTe, SnSeS, SnSeTe, SnSTe, PbSeS, PbSeTe, PbSTe, SnPbS, SnPbSe, SnPbTe, SnPbSSe, SnPbSeTe, SnPbSTe of the IV-VI compounds.

In addition to the quantum dot matrix material configured to form the quantum dot film, the quantum dot film further comprises the ligands attached to the surfaces of the quantum dot matrixes. The ligands on the surfaces of the quantum dots generally can reduce the surface defects of the quantum dots, and improve the illumination property of the quantum dots. Different from the surface ligands on conventional quantum dots, the ligands according to embodiments of this application include the first ligands having a structure formula as represented by Formula 1:

Formula 1

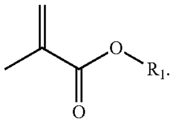

In Formula 1, $R_1$ is selected from a substitute containing between one and six carbon atoms and having a first active group at a terminal; and the first ligands are cross-linked through polymerization of double bonds to form a network structure.

In such case, on the one hand, the polymerization network is formed among the first ligands, so that the distance between the quantum dots is reduced, the tunneling effect of the charges is enhanced, moreover, the formed polymerization network has a certain conjugated conductivity, therefore, the radiation transition ability and the carrier migration ability of the quantum dot film are enhanced. On the other hand, the polymerization reaction between the first ligands improves the order degree of the quantum dot film, which modifies the grain boundaries in the superlattice, reduces grain boundary defects, improves the crystallinity of the film, and therefore enhances the carrier mobility of quantum dot film. In this way, the charge accumulation in the quantum dot light-emitting layer and the transport layer of the quantum dot light-emitting device is reduced, so that both the service life and the luminous efficiency of the quantum dot light-emitting device are improved, which has great significance for realizing a high-quality multilayer combined film structure.

Figure 2:
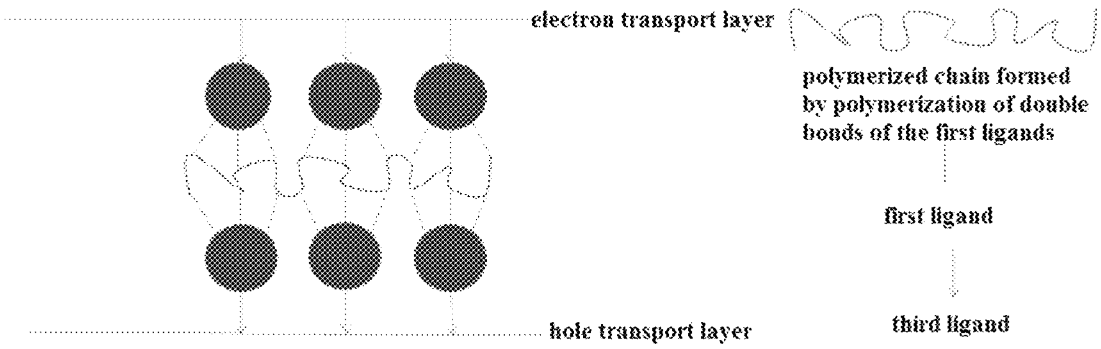
FIG. 2 is a schematic diagram of a quantum dot film after film formation of quantum dots having both the first ligands and the third ligands attached to surfaces thereof, and interfaces between the quantum dot film and the hole transport layer, and between the quantum dot film and the electron transport layer.

Specifically, in Formula 1, since the first ligands contain double bonds, the first ligands are polymerized through the double bonds, the ligands of different quantum dots can be connected. Thus, as shown in FIGS. 1 and 2, the quantum dots in the same layer and the quantum dots in different layers are connected to one other, thereby shortening the distance between the quantum dots in the same layer and the distance between the quantum dots in adjacent layers. The quantum dots in the adjacent layers are polymerized to form a chain polymer. The quantum dots are arranged in an orderly manner as shown in the figures, and are closely connected by ligands to form a preferred orientation, which provides the basic framework for the crystallization of quantum dot film. Due to the shortened distances of the quantum dots, the charge transport in the quantum dots in the adjacent layers and the charge transport in the quantum dots in the same layer are both enhanced. Based on this, the carrier migration ability of the quantum dot film is enhanced, and the charge accumulation in the quantum dot light-emitting layer and the transport layer of the quantum dot light-emitting device is reduced, so that both the service life and the luminous efficiency of the quantum dot light-emitting device are improved.

$R_1$ is selected from a substitute containing between one and six carbon atoms and having a first active group at a terminal. In such case, the first ligand represented by Formula 1 has a carbon atom length of between 4 and 10, and therefore has relatively good steric hindrance, which increases the difficulty of introducing the first ligands to the surfaces of the quantum dots. More importantly, the distance between the quantum dots can be controlled within a suitable range through the cross-linking among the first ligands. If the carbon chain of $R_1$ is too long, the distance between the quantum dots will be increased after the polymerization of the first ligands. In particular, the first active group is located at a terminal of $R_1$, as well as at a terminal of Formula 1, thereby facilitating the binding of the first ligands to the surfaces of the quantum dots during the preparation process. In an embodiment of the present application, the first active group is at least one selected from the group consisting of carboxyl, hydroxyl, amino, and sulfhydryl.

In some embodiments, the first ligands are at least one selected from the group consisting of hydroxyethyl methacrylate, hydroxypropyl methacrylate, and hydroxybutyl methacrylate.

On the basis of the above embodiments, in some other embodiments, the second ligands are further attached to the surfaces of the quantum dots, and each of the second ligands is a compound having a structure represented by Formula 2:

Formula 2

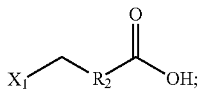

in which, $X_1$ represents the second active group attached to the quantum dots; $R_2$ represents $—(CH_2)_n—$, n represents an integer, and n ranges between 1 and 10.

In this case, the surface of the quantum dot matrix contains both the first and second ligands. As shown in FIG. 1, the cross-linking polymerization of the first ligands shortens the distance between quantum dots in the same layer and the distance between quantum dots in different layers, and modifies the grain boundaries in the superlattice, thereby reducing grain boundary defects, improving the crystallinity of the film, finally enhancing the carrier migration ability of the quantum dot film, and reducing the charge accumulation in the quantum dot light-emitting layer and the transport layer of the quantum dot light-emitting device. In addition, during the preparation process, especially the polymerization process, the chain polymers formed between the quantum dots of different layers are prone to generate sheet-like crystals under heating conditions. On this basis, the quantum dots of different layers are connected by second ligands to form a quantum dot-second ligand-quantum dot structure, the formed sheet crystals are therefore connected and stacked to form a layered crystal, and the quantum dots of the layered crystal has much stronger carrier transport ability. That is, after the quantum dot-second ligand-quantum dot structure can act as a charge transport center, the longitudinal conductivity is better than that of the sheet-like crystal, thereby improving the conductivity of the quantum dot film. In addition, since the second ligand contains a carboxyl group, and has a strong affinity with the electron transport layer, when the quantum dot film is in contact with the electron transport layer, the contact surface between the quantum dot film and the electron transport layer includes the second ligands. In such case, the interface between the quantum dot film and the electron transport layer can form the electron transport layer material-second ligand-quantum dot structure (the interface between the quantum dot film and the electron transport layer mainly includes the second ligands, at the interface, the quantum dots can be connected to the electron transport layer material through the second ligands). The electron transport layer material-second ligand-quantum dot structure can modify the quantum dot film/electron the transport layer interface, reduce the internal stress of the interface, reduce the contact angle when preparing the quantum dot film on the electron transport layer or when preparing the electron transport layer on the quantum dot film by the solution process method, and improve the density of the film layer, thereby improving the film formation quality of the film layer, and further enhancing the transport capacity of the interface carriers. Thus, it become much easier to inject the electrons from the electron transport layer to the quantum dot light-emitting layer, the charge accumulation at the interface is reduced, and the luminous efficiency and service life of the quantum dot light-emitting device are improved.

In a second ligands as represented by Formula 2, $X_1$ represents the second active group combined with the quantum dots. The second active group is selected from carboxyl, hydroxyl, amino, and sulfhydryl. In some embodiments, the second active group is carboxyl. $R_2$ is $—(CH_2)_n—$, n is a positive integer, and n ranges between 1 and 10.

In some embodiments, the second ligands are at least one selected from the group consisting of suberic acid, pimelic acid, and azelaic acid. The introduction of both the first ligands and the above-mentioned second ligands to the surface of the quantum dot matrix at the same time can more significantly solve the problems of low conductivity and low carrier mobility of the quantum dot layer, and improve the luminous efficiency and the service life of the quantum dot light-emitting device.

In some embodiments, a molar ratio of the second ligands to the first ligands is 1:1-3:1, which is beneficial for improving the density of the film layer, thereby improving the film formation quality of the film layer, and further enhancing the transport capacity of the interface carriers On basis of the above embodiments, in some embodiments, third ligands are further attached to the surfaces of the quantum dots. The third ligands are compounds containing at least one of a fused ring, biphenyl, and at least two continuous double bonds, and the third active group. In such case, the surface of the quantum dot matrix contains both the first ligands and the third ligands. Therefore, as shown in FIG. 2, the cross-linking polymerization of the first ligands shortens the distance between quantum dots in the same layer and the distance between quantum dots in different layers, and modifies the grain boundaries in the superlattice, thereby reducing grain boundary defects, improving the crystallinity of the film, finally enhancing the carrier migration ability of the quantum dot film, and reducing the charge accumulation in the quantum dot light-emitting layer and the transport layer of the quantum dot light-emitting device. In addition, the chain polymer formed between the quantum dots of different layers tightly connects the quantum dots, to form a preferred orientation, which provides the basic framework for the crystallization of the quantum dot layer. During the preparation process, the chain polymer is annealed to form the sheet-like crystals, which makes the quantum dot superlattice structure also have a sheet-like superlattice structure. Such a structure has better planar two-dimensional conductivity, that is, the quantum dot film has better in-plane conductivity. On this basis, organic compounds having strong conjugation effects (containing at least one of a fused ring, biphenyl, and at least two continuous double bonds) are used as the third ligands of the quantum dot film, which can increase the affinity between the quantum dot film and the hole transport layer, and the positive surface potential of the fused ring, biphenyl, and the at least two continuous double bonds in the third ligands facilitates hole conduction, thereby promoting carrier conduction and enhancing the interface conductivity with the assistance of the conjugation effect of the third ligands. Meanwhile, due to the poor affinity between the electron transport layer and the chain polymer formed by the polymerization of the double bonds between the first ligands, which affects the film formation of the electron transport layer and the injection of electrons, an organic compound containing at least one of the fused ring, biphenyl, and at least two continuous double bonds is formed at the interface between the electron transport layer and the quantum dot light-emitting layer film. In this way, the charge transport capability in the longitudinal direction of the sheet-like crystals in the quantum dot film is enhanced, the influence of the poor affinity between the chain polymer and the electron transport layer on the film formation and the electron injection effect of the electron transport layer is overcome, the charge accumulation at the interface between the quantum dot film and the electron transport layer is effectively reduced, the charge accumulation of the quantum dot light-emitting device is therefore reduced. Thus, it is solved the problem that the charge is easy to accumulate at the interface and the shell of the quantum dot and the problem that electrons and holes are difficult to meet, and the service life and luminous efficiency of the quantum dot light-emitting device are improved.

In some embodiments, the third ligands are at least one selected from Formula 3, Formula 4, and Formula 5;

Formula 3

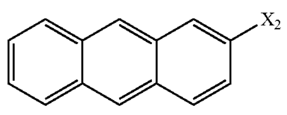

Formula 4

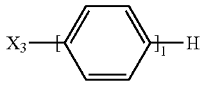

Formula 5

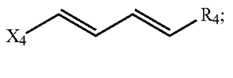

in which, $X_2$, $X_3$, and $X_4$ are independently and respectively selected from the third active group attached with the quantum dots; 1 represents a positive integer between 1 and 6; and $R_4$ is selected from alkenyl or alkyl having between 1 and 20 carbon atoms.

In some embodiments, the third ligands are at least one selected from the group consisting of terphenyl-4-carboxylic acid, 1,1',4',1"-terphenyl-4-thiol, 2,4-hexadienoic acid, trans,trans-2,4-hexadien-1-ol, 2-anthracenecarboxylic acid, and 2-aminoanthracene.

In some embodiments, a molar ratio of the third ligands to the quantum dot matrixes is 0.5-5:1, which is beneficial for the third ligands to have the above effects.

The quantum dot film provided by the first aspect of embodiments of the present application may be prepared by the following method.

Figure 3:
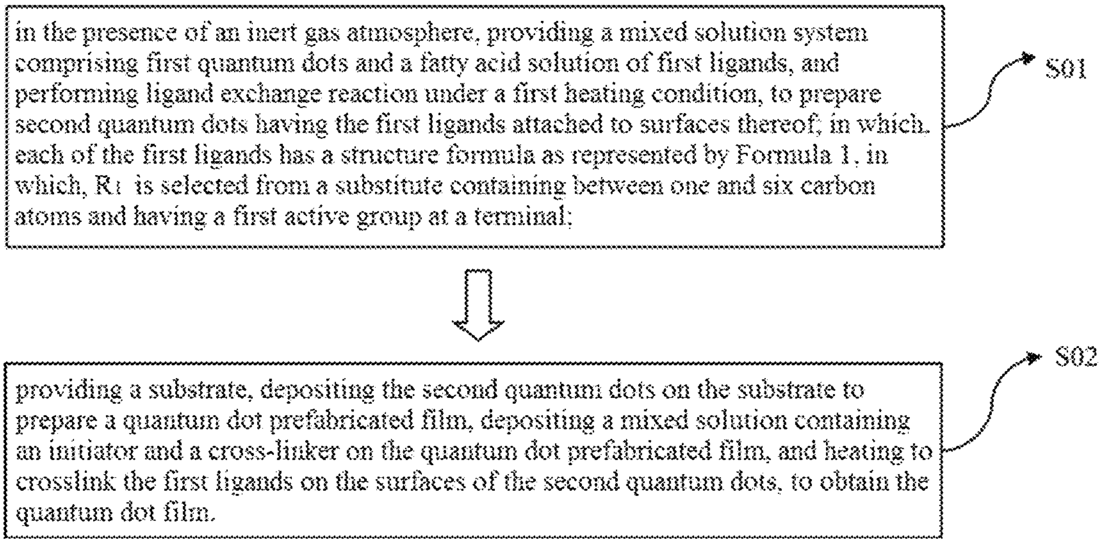
FIG. 3 is a flowchart of a process for preparing a quantum dot film provided by the embodiment of the present application.

With reference to FIG. 3, a second aspect of embodiments of the present application provides a method for preparing a quantum dot film, which comprises the following steps:

S01, in the presence of an inert gas atmosphere, providing a mixed solution system comprising first quantum dots and a fatty acid solution of first ligands, and performing ligand exchange reaction under a first heating condition, to prepare second quantum dots having the first ligands attached to surfaces thereof; in which, each of the first ligands has a structure formula as represented by Formula 1, Formula 1

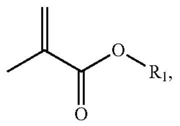

in which, $R_1$ is selected from a substitute containing between one and six carbon atoms and having a first active group at a terminal; and S02, providing a substrate, depositing the second quantum dots on the substrate to prepare a quantum dot prefabricated film, depositing a mixed solution containing an initiator and a cross-linker on the quantum dot prefabricated film, and heating to crosslink the first ligands on the surfaces of the second quantum dots, to obtain the quantum dot film; or alternatively, providing a substrate, adding an initiator and a cross-linker to the second quantum dots, and depositing a resulting mixed system onto the substrate, heating to crosslink the first ligands on the surfaces of the second quantum dots, to obtain the quantum dot film.

In the method for preparing the quantum dot film provided in embodiments of the present application, first ligands are bound onto the surfaces of the quantum dots, and the first ligands contain double bonds. Under the catalysis of the initiator and the cross-linker, the polymerization reaction between the first ligands on the surfaces of the quantum dots is initiated, so that the first ligands form the polymerization network between the quantum dots. In such case, through the polymerization network among the first ligands, the first ligands of different quantum dots are connected, so that the distance between the quantum dots is reduced, the tunneling effect of the charges is enhanced. Moreover, the formed polymerization network has a certain conjugated conductive ability; therefore, the radiation transition ability and the carrier migration ability of the quantum dot film are enhanced. Meanwhile, the polymerization reaction between the first ligands improves the order degree of the quantum dot film, which modifies the grain boundaries in the superlattice, reduces grain boundary defects, improves the crystallinity of the film, and therefore enhances the carrier mobility of quantum dot film. In this way, the charge accumulation in the quantum dot light-emitting layer and the transport layer of the quantum dot light-emitting device is reduced, so that both the service life and the luminous efficiency of the quantum dot light-emitting device are improved, which has great significance for realizing a high-quality multilayer combined film structure.

Specifically, in the above step S01, the first ligands and the first quantum dots to be reacted are provided under an inert atmosphere. The inert atmosphere refers to an inert gas atmosphere or a vacuum atmosphere; the first quantum dots refer to quantum dots containing ligands to be exchanged on surfaces thereof. The quantum dot material (without surface ligands) in the first quantum dots can be the core structure or the core-shell structure. In some embodiments, the core compound and the shell compound of the quantum dot matrix may be independently selected from, but not limited to, any one or any combination of: CdS, CdSe, CdTe, ZnS, ZnSe, ZnTe, ZnO, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, and HgZnSTe of the II-VI compounds; GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InNP, InNAs, InNSb, InPAs, InPSb, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb of the III-V compounds; and SnS, SnSe, SnTe, PbS, PbSe, PbTe, SnSeS, SnSeTe, SnSTe, PbSeS, PbSeTe, PbSTe, SnPbS, SnPbSe, SnPbTe, SnPbSSe, SnPbSeTe, SnPbSTe of the IV-VI compounds.

In an embodiment of the present application, each of the first ligands has a structure formula represented by Formula 1:

Formula 1

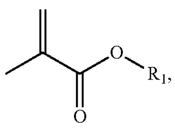

in which $R_1$ is selected from a substitute containing between one and six carbon atoms and having a first active group at a terminal.

Specifically, in Formula 1, the first ligand contains double bonds, and the first ligands are polymerized through the double bonds, therefore, the ligands of different quantum dots can be connected to form a polymerized network. $R_1$ is selected from a substitute containing between one and six carbon atoms and having a first active group at a terminal. In such case, the first ligand represented by Formula 1 has a carbon atom length of between 4 and 10, and therefore has relatively good steric hindrance, which increases the difficulty of introducing the first ligands to the surfaces of the quantum dots. More importantly, the distance between the quantum dots can be controlled within a suitable range through the cross-linking among the first ligands. In particular, the first active group is located at a terminal of $R_1$, as well as at a terminal of Formula 1, thereby facilitating the binding of the first ligands to the surfaces of the quantum dots during the preparation process. In an embodiment of the present application, the first active group is at least one selected from the group consisting of carboxyl, hydroxyl, amino, and sulfhydryl.

In some embodiments, the first ligands are at least one selected from the group consisting of hydroxyethyl methacrylate, hydroxypropyl methacrylate, and hydroxybutyl methacrylate.

In some embodiments, the step of providing the mixed solution system comprising the first quantum dots and the fatty acid solution of the first ligands comprises: preparing the fatty acid solution of the first ligands and a nonpolar solution of the first quantum dots, respectively, and mixing the two to obtain the mixed solution system. The nonpolar solution of the first quantum dots is prepared by dispersing the quantum dots in a nonpolar solvent. The use of a nonpolar solvent can improve the dispersibility of quantum dots, especially the dispersibility of the quantum dots having initial ligands on the surfaces thereof, and can prevent quantum dots from agglomerating and precipitating in polar solvents, which would otherwise affect the ligand exchange on the surfaces of quantum dots. In the fatty acid solution of the first ligands, the fatty acid serves as the solvent of the first ligands, which provides a good dissolved state for the first ligands to participate in the reaction. More importantly, since the first quantum dot solution adopts a nonpolar solvent, the addition of the fatty acid can improve the infiltration and penetration of the first ligands in the quantum dot solution, enhance the affinity and solubility of the first ligands to the quantum dot solution, and promote the progress of the ligand exchange reaction. In some embodiments, a fatty acid in the fatty acid solution of the first ligands is at least one selected from n-octanoic acid, acetic acid, n-hexanoic acid, n-butyric acid, and n-valeric acid.

In some embodiments, in the mixed solution system comprising the first quantum dots and the fatty acid solution of the first ligands, a molar ratio of the first ligands to the first quantum dots is 50-100:1, which enables the first ligands to fully exchange with the surface ligands of the first quantum dots, so as to obtain the second quantum dots having the first ligands attached to the surfaces thereof. If the relative content of the first ligands is too high, for example, higher than 100:1, due to too many of the ligands, the polarity of the quantum dots is significantly increased, resulting in easy precipitation of the quantum dots.

In a first implementation manner, the first quantum dots are quantum dots having surfaces containing initial ligands, and the initial ligands are usually surface ligands introduced during the preparation of the quantum dot. In this case, by performing ligand exchange reaction under the first heating condition, the initial ligands on the surfaces of the first quantum dots can be replaced with the first ligands containing double bond structures. Specifically, the first ligands are bound to surfaces of the first quantum dots through the first active groups to form the second quantum dots having the first ligands attached to the surfaces thereof.

In the step of performing the ligand exchange reaction under the first heating condition, the first heating condition comprises a temperature of between 100 and 200° C., and a duration for the ligand exchange reaction is between 20 and 40 min. If the temperature of the first heating condition is too low or the reaction time is too short, it is difficult to effectively exchange the surface ligands of the first quantum dots, and even that the ligand exchange reaction cannot occur effectively. If the temperature of the first heating condition is too high or the reaction time is too long, on the one hand, hetero and side reactions are likely to occur, affecting the effect of ligand exchange of the quantum dots, and introducing into the quantum dots impurities that are difficult to be removed; on the other hand, if the temperature is too high, the temperature will reduce the activity of the exchange reaction and affect the effect of ligand exchange. In addition, too high temperature easily leads to volatilization of fatty acids, which is unfavorable for the contact between the first ligands and the first quantum dots, and increases the difficulty of ligand exchange between the first quantum dots and the first ligands.

In a second implementation manner, the first quantum dots are quantum dots having second ligands attached to surfaces thereof. In such case, during the ligand exchange reaction carried out in the first heating condition in the mixed solution system of the first quantum dots and the fatty acid solution of the first ligands, the first ligands replace a part of the second ligands on the surfaces of the first quantum dots, so as to obtain second quantum dots having both the first ligands and the second ligands attached to surfaces thereof, that is, the first ligands and the second ligands are both attached to surfaces of the second quantum dots.

Specifically, each of the second ligands has a structure formula as represented by Formula 2, Formula 2

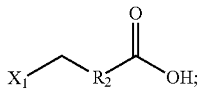

in which, $X_1$ is a second active group configured to bind with the quantum dots, $R_2$ is $-(CH_2)_n-$, n is a positive integer, and n ranges between 1 and 10.

In such case, under the first heating condition and subject to the ligand exchange reaction, the second quantum dots having both the first ligands and the second ligands attached to the surfaces thereof can be obtained.

In the second ligand shown in Formula 2, $X_1$ is the second active group bound to the quantum dot. The polarity of the second active group is weaker than that of the first active group, so that in the process of the ligand exchange reaction under the first heating condition, the first ligands can replace the second ligands on the surface of the first quantum dot, so as to obtain a second quantum dot containing both the first ligands and the second ligands. On the premise that the polarity of the second active group is weaker than that of the first active group, the second active group is one selected from the group consisting of carboxyl, hydroxyl, amino, and sulfhydryl, which can be selected according to the first active group. In the second ligand represented by Formula 2, $R_2$ is $-(CH_2)_n-$, n is a positive integer, and n ranges between 1 and 10.

In some embodiments, the second ligands are at least one selected from the group consisting of suberic acid, pimelic acid, and azelaic acid. The simultaneous introduction of the first ligands and the above-mentioned second ligands onto the surfaces of the quantum dot matrix can solve the problems of low conductivity and low carrier mobility of the quantum dot layer, and significantly improve the luminous efficiency and service life of the quantum dot light-emitting device.

In case that the first quantum dots are quantum dots having second ligands attached to the surfaces thereof, the first quantum dots are prepared as follows:

In S011, original quantum dots and a fatty acid solution of a compound A are provided, and the original quantum dots and the fatty acid solution of the compound A are mixed to form a mixed solution system, ligand exchange reaction is performed under a second heating condition to prepare quantum dots having the compound A attached to surfaces thereof; in which, the compound A has a structure formula as follows:

Compound A

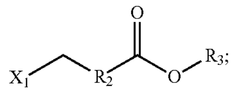

in which, $X_1$ is a second active group configured to bind with one of the quantum dots, $R_2$ is $-(CH_2)_n-$, $R_3$ is a straight chain $C_mH_{2m+1}$, m and n are positive integers, and m+n ranges between 2 and 12.

In the above step, the compound A and the original quantum dots that are to be reacted are provided in the presence of an inert gas atmosphere. The inert atmosphere refers to an inert gas atmosphere or a vacuum atmosphere; the original quantum dots refer to quantum dots containing original ligands on surfaces thereof. The original quantum dot material (without surface ligands) in the original quantum dots are the same as described in the above, which are not repeated herein for simplicity.

In embodiments of the present application, in the compound A, $X_1$ represents the second active group configured to be bound with the quantum dots; $R_2$ represents $-(CH_2)_n-$, $R_3$ represents a straight chain $C_mH_{2m+1}$, m and n are both positive integer, and n+m ranges between 2 and 12. In such condition, the compound A is capable of exchanging the surface ligands of the original quantum dots under the second heating condition, and binding to the surfaces of the quantum ligands through the second active group, thus obtaining the first quantum dots having the second ligands attached to the surfaces thereof.

Specifically, in the compound A, the ester group can be hydrolyzed in the following step S012 to obtain a second ligand containing a carboxyl group; a value of n+m satisfies a range of between 2 and 12. In such condition, the carbon atom length of the compound A is suitable, thus, the compound A has relatively smaller steric hindrance and better solubility, which reduces the difficulty of introducing compound A to the surface of the quantum dots. In some embodiments, the compound A is at least one selected from monomethyl suberate, monoethyl heptandilate, and monoethyl azelaate.

In some embodiments, the step of providing the mixed solution system comprising the first quantum dots and the fatty acid solution of the first ligands comprises: preparing a fatty acid solvent of the compound A and a nonpolar solution of the original quantum dots, respectively, and mixing the same to obtain the mixed solution system. The nonpolar solution of the original quantum dots is prepared by dispersing the quantum dots in a nonpolar solvent. The use of a nonpolar solvent can improve the dispersibility of the original quantum dots and can prevent the original quantum dots from agglomerating and precipitating in polar solvents, which would otherwise affect the ligand exchange on the surfaces of quantum dots. In the fatty acid solution of the compound A, the fatty acid serves as the solvent of the compound A, and provides a good dissolved state for the compound A to participate in the ligand exchange reaction. More importantly, since the original quantum dot solution adopts a nonpolar solvent, the addition of the fatty acid can improve the infiltration and penetration of the compound A in the original quantum dot solution, enhance the affinity and solubility of the compound A to the original quantum dot solution, and promote the progress of the ligand exchange reaction. In some embodiments, a fatty acid in the fatty acid solution of the compound A is at least one selected from n-octanoic acid, acetic acid, n-hexanoic acid, n-butyric acid, and n-valeric acid.

In some embodiments, in the mixed solution system comprising the original quantum dots and the fatty acid solution of the compound A, a molar ratio of the compound A to the original quantum dots is 50-100:1, which enables the compound A to fully exchange with the surface ligands of the original quantum dots, so as to obtain the first quantum dots having the compound A attached to the surfaces thereof. If the relative content of the compound A is too high, for example, higher than 100:1, due to too many of the ligands, the polarity of the quantum dots is significantly increased, resulting in easy precipitation of the quantum dots. On such basis, in the step of providing the mixed solution system comprising the first quantum dots and the fatty acid solution of the first ligands, the mixed solution system is prepared according to a molar ratio of the compound A to the first ligands of between 1:1 and 3:1. Therefore, the obtained second quantum dots has a molar ratio of the second ligands attached to the surfaces thereof to the first ligands attached to surfaces being 1:1-3:1.

In some embodiments, in the step of performing ligand exchange reaction under a second heating condition, the second heating condition comprises a temperature of between 100 and 200° C. and a duration for the ligand exchange reaction is between 2 and 4 hrs. If the temperature of the second heating condition is too low or the reaction time is too short, it is difficult to effectively exchange the surface ligands of the original quantum dots, and even that the ligand exchange reaction cannot occur effectively. If the temperature of the second heating condition is too high or the reaction time is too long, on the one hand, hetero and side reactions are likely to occur, affecting the effect of ligand exchange of the quantum dots, and introducing into the quantum dots impurities that are difficult to be removed; on the other hand, if the temperature is too high, the temperature will reduce the activity of the exchange reaction and affect the effect of ligand exchange. In addition, too high temperature easily leads to volatilization of fatty acids, which is unfavorable for the contact between the compound A and the second quantum dots, and increases the difficulty of ligand exchange between the original quantum dots and the compound A. On such basis, in the step performing ligand exchange reaction under a first heating condition, the first heating condition comprises a temperature of between 60 and 90° C. and a duration for the ligand exchange reaction is between 4 and 14 hrs, which facilitates the exchange between the first ligands and the second ligands on the surfaces of the first quantum dots.

In S012, the compound A on the surfaces of the quantum dots are hydrolyzed, and the first quantum dots having the second ligands attached to surfaces thereof are obtained.

In step S012, in some embodiments, the compound A on the surfaces of the quantum dots is hydrolyzed as follows: a mixed solution comprising fatty acids and ethanol is added to the quantum dots having the compound A attached to the surfaces thereof, performing hydrolyzation reaction under a temperature of 60° C.-80° C. for 1.5-2.5 hrs, thereby obtaining the second ligands represented by the Formula 2.

As a second implementation manner based on the above embodiments, in the step of providing the mixed solution system comprising the first quantum dots and the fatty acid solution of the first ligands, the first quantum dots and the fatty acid solution of the first ligands are added according to a molar ratio of the second ligands to the first ligands of 1:3-3:1.

As a third implementation manner, third ligands are further attached to the surfaces of the second quantum dots. Each of the third ligands is at least one selected from the group consisting of a fused ring, biphenyl, and $-(CH{=}CH-CH{=}CH)_n-$, and the third active group. A polarity of the third active group is greater than a polarity of the first active group. In such case, the second quantum dot matrix contains both the first ligands and the third ligands attached to the surfaces thereof.

In some embodiments, the third ligands are at least one selected from Formula 3, Formula 4, and Formula 5;

Formula 3

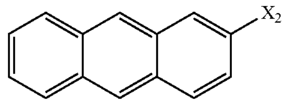

Formula 4

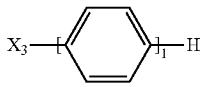

Formula 5

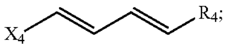

in which, $X_2$, $X_3$, and $X_4$ are independently and respectively selected from the third active group attached with the quantum dots; 1 represents a positive integer between 1 and 6; and $R_4$ is selected from alkenyl or alkyl having between 1 and 20 carbon atoms.

In the third ligands as shown in Formula 3, Formula 4, and Formula 5, $X_1$, $X_2$, and $X_3$ are independently selected from the third active group bound to the quantum dot matrix. The polarity of the third active group is stronger than that of the first active group, so that in the process of the ligand exchange reaction under the third heating condition, part of the first ligands can be replaced by the third ligands, so as to obtain the second quantum dots containing both the first ligands and the third ligands. On the premise that the polarity of the second active group is stronger than that of the first active group, the third active group is one selected from carboxyl, hydroxyl, amino, and sulfhydryl, which can be specifically selected according to the condition of the first active group. The third ligands as shown in Formula 3, Formula 4, and Formula 5 contain at least one of the fused ring, biphenyl, and at least two continuous double bonds. In such case, the introduction of the third ligands on the quantum dot surface at the same time can improve the electron injection efficiency at the interface between the quantum dot film and the electron transport layer and the hole mobility between the quantum dot film and the hole transport layer through the conjugation effect of the third ligands, reduces the charge accumulation at the interface, enhance the charge transfer between crystals in the quantum dot film, and improve the luminous efficiency and service life of the quantum dot light-emitting device. In some embodiments, the third ligands are at least one selected from terphenyl-4-carboxylic acid, 1,1',4',1"-terphenyl-4-thiol, 2,4-hexadienoic acid, trans, trans-2,4-hexadien-1-ol, 2-anthracenecarboxylic acid, and 2-aminoanthracene.

In some embodiments, the step of attaching the third ligands to the surfaces of the second quantum dots comprises: in the presence of the inert gas atmosphere, providing the second quantum dots and a fatty acid solution of the third ligands; mixing the second quantum dots and the fatty acid solution of the third ligands to form a mixed solution system, performing ligand exchange reaction under a third heating condition, to prepare quantum dots having both the first ligands and the third ligands attached to surfaces thereof.

In this method, in the presence of an inert atmosphere, the second quantum dots and the fatty acid solution of the third ligands are mixed to form the mixed solution system. The inert atmosphere refers to an inert gas atmosphere or a vacuum atmosphere; and the second quantum dots refer to quantum dots containing first ligands on surfaces thereof. The quantum dot material (not including the surface ligands) in the second quantum dots is the same as those described in the above, which will not be repeated herein for simplicity.

The step of mixing the second quantum dots and the fatty acid solution of the third ligands to form the mixed solution system comprises: preparing a fatty acid solvent of the third ligands and a solution of the second quantum dots, respectively, and mixing the same to obtain the mixed solution system. In the fatty acid solution of the third ligands, the fatty acid serves as the solvent of the third ligands, which provides a good dissolved state for the third ligands to participate in the ligand exchange reaction. More importantly, the fatty acid can improve the infiltration and penetration of the third ligands in the quantum dot solution, enhance the affinity and solubility of the third ligand to the first quantum dot solution, and promote the progress of the ligand exchange reaction. In some embodiments, a fatty acid in the fatty acid solution of the third ligands is at least one selected from the group consisting of n-octanoic acid, acetic acid, n-hexanoic acid, n-butyric acid, and n-valeric acid.

In some embodiments, in the mixed solution system comprising the second quantum dots and the fatty acid solution of the third ligands, a molar ratio of the third ligands to the second quantum dots is 0.5-5:1.

In some embodiments, in the step of performing the ligand exchange reaction under the first heating condition, the first heating condition comprises a temperature of between 100 and 200° C. and a duration for the ligand exchange reaction is between 2 and 4 hrs. On such basis, in the step of performing the ligand exchange reaction under the third heating condition, the third heating condition comprises a temperature of between 80 and 120° C., and a duration of the ligand exchange reaction is between 8 and 16 hrs. If the temperature of the third heating condition is too low or the reaction time is too short, it is difficult to effectively exchange the first ligands on the surfaces of the second quantum dots, and even that the ligand exchange reaction cannot occur effectively. If the temperature of the third heating condition is too high or the reaction time is too long, on the one hand, hetero and side reactions are likely to occur, affecting the effect of ligand exchange of the quantum dots, and introducing into the quantum dots impurities that are difficult to be removed; on the other hand, if the temperature is too high, the temperature will reduce the activity of the exchange reaction and affect the effect of ligand exchange. In addition, too high temperature easily leads to volatilization of fatty acids, which is unfavorable for the contact between the third ligands and the second quantum dots, and increases the difficulty of ligand exchange between the second quantum dots and the third ligands.

On the basis of the above three implementation manners, step S01 further comprises: dispersing a resulting reaction system in a polar solvent, collecting a quantum dot precipitate, dissolving the quantum dot precipitate into a nonpolar solvent, and repeating these operations for at least one time. In such case, the second quantum dots are precipitated by the polar solvent, centrifuged, and collected; after that, the collected second quantum dots are dispersed in a nonpolar solvent to form a second quantum dot solution. The steps are repeated for several times, so as to obtain a high-purity second quantum dots.

In the above step S02, in the first implementation manner, a substrate is provided, and a second quantum dot is deposited on the substrate to prepare a quantum dot prefabricated film. Then, a mixed solution containing the initiator and the cross-linker is deposited on the quantum dot prefabricated film, then the quantum dot prefabricated film is heated to crosslink the first ligands on the surfaces of the quantum dots, thus obtaining the quantum dot film. The substrate is a substrate on which the quantum dot film is to be deposited, and in the preparation process of the quantum dot light-emitting diode, the substrate can be the anode or the cathode, and can also be the electron transport layer or the hole transport layer.

The quantum dot prefabricated film is prepared by depositing the second quantum dots on the substrate, which can be realized by solution processing methods, including but not limited to spin coating, inkjet printing, blade coating, and the like.

In some embodiments of the present application, the step of depositing a mixed solution containing the initiator and the cross-linker on the quantum dot prefabricated film can be achieved by a solution method, such as forming the mixed solution containing the initiator and the cross-linker on the surface of the quantum dot prefabricated film by means of spin coating, blade coating, and inkjet.

In some embodiments, the mixed solution containing the initiator and the cross-linker is deposited on the quantum dot prefabricated film, and then heated to cause the polymerization reaction of the first ligands on the surfaces of the quantum dots to form the polymerization network.

In some embodiments, in the mixed solution containing the initiator and the cross-linker, the initiator is at least one selected from the group consisting of azobisisobutyronitrile (AIB) and benzoyl peroxide. In some embodiments, in the mixed solution containing the initiator and the cross-linker, the cross-linker is at least one selected from the group consisting of ethylene glycol dimethacrylate and divinylbenzene In some embodiments, based on a total weight of the mixed solution containing the initiator and the cross-linker as 100%, a weight percentage of the initiator accounts for 1%-5%, and a weight percentage of the cross-linker accounts for 1%-5%.

In some embodiments, the step of heating to crosslink the first ligands on the surfaces of the second quantum dots is performed at a temperature of between 60 and 90° C. for a reaction duration of between 24 and 48 hrs. Under such conditions, effective polymerization between the first ligands occurs, which will not affect other properties of a resulting quantum dot film. In addition, such condition is equivalent to annealing the quantum dot prefabricated film. During this process, the first ligands on the surface of the quantum dots between different layers of the quantum dot film are polymerized to form the chain polymer, and the quantum dots are arranged in an orderly manner. The ligands are tightly connected to form a preferred orientation, which provides the basic framework for the crystallization of quantum dot film. Due to the shortened spacing between quantum dots, both the charge transport between the quantum dots of different layers and the charge transport between the quantum dots of the same layers are both enhanced, and the chain polymer forms the sheet-like crystals through molecular folding and rotation after heat treatment.

In the second implementation manner, a substrate is provided, the initiator and the cross-linker are added to the second quantum dots, an obtained mixed system is deposited on the substrate, and the substrate is then heated to crosslink the first ligands on the surface of the quantum dots, so as to prepare the quantum dot film. The selections of the substrate, the initiator, and the cross-linker, and the conditions for the crosslinking of the first ligands on the surfaces of the quantum dots by heating are all the same as those in the first implementation manner, which will not be repeated herein for simplicity.

In the above two implementation manners, the first ligands on the surfaces of the quantum dots are crosslinked by heating to prepare the quantum dot film. Specifically, the first ligands are polymerized through the double bonds, therefore, the ligands of different quantum dots can be connected. Thus, the quantum dots in the same layer and the quantum dots in different layers are connected to one other, thereby shortening the distance between the quantum dots in the same layer and the distance between the quantum dots in adjacent layers. The quantum dots in the adjacent layers are polymerized to form a chain polymer. The quantum dots are arranged in an orderly manner and are closely connected by ligands to form a preferred orientation, which provides the basic framework for the crystallization of quantum dot film. Due to the shortened distances of the quantum dots, the charge transport in the quantum dots in the adjacent layers and the charge transport in the quantum dots in the same layer are both enhanced, and the chain polymers form sheet-like crystals through molecular folding and rotation after annealing. Based on this, the carrier migration ability of the quantum dot film is enhanced, and the charge accumulation in the quantum dot light-emitting layer and the transport layer of the quantum dot light-emitting device is reduced, so that both the service life and the luminous efficiency of the quantum dot light-emitting device are improved.

In some embodiments, the surface of the second quantum dot contains both the first and second ligands. As shown in FIG. 1, the cross-linking reaction between the first ligands on the surfaces of the second quantum dots is initiated by the mixed solution of the initiator and the cross-linker, the cross-linking polymerization of the first ligands shortens the distance between quantum dots in the same layer and the distance between quantum dots in different layers, and modifies the grain boundaries in the superlattice, thereby reducing grain boundary defects, improving the crystallinity of the film, finally enhancing the carrier migration ability of the quantum dot film, and reducing the charge accumulation in the quantum dot light-emitting layer and the transport layer of the quantum dot light-emitting device. In addition, during the preparation process, especially the polymerization process, the chain polymers formed between the quantum dots of different layers are prone to generate sheet-like crystals under heating conditions. On this basis, the quantum dots of different layers are connected by second ligands to form a quantum dot-second ligand-quantum dot structure, the formed sheet crystals are therefore connected and stacked to form a layered crystal, and the quantum dots of the layered crystal has much stronger carrier transport ability. That is, after the quantum dot-second ligand-quantum dot structure can act as a charge transport center, the longitudinal conductivity is better than that of the sheet-like crystal, thereby improving the conductivity of the quantum dot film. In addition, since the second ligand contains a carboxyl group, and has a strong affinity with the electron transport layer, when the quantum dot film is in contact with the electron transport layer, the contact surface between the quantum dot film and the electron transport layer includes the second ligands. In such case, the interface between the quantum dot film and the electron transport layer can form the electron transport layer material-second ligand-quantum dot structure (the interface between the quantum dot film and the electron transport layer mainly includes the second ligands, at the interface, the quantum dots can be connected to the electron transport layer material through the second ligands). The electron transport layer material-second ligand-quantum dot structure can modify the quantum dot film/electron the transport layer interface, reduce the internal stress of the interface, reduce the contact angle when preparing the quantum dot film on the electron transport layer or when preparing the electron transport layer on the quantum dot film by the solution process method, and improve the density of the film layer, thereby improving the film formation quality of the film layer, and further enhancing the transport capacity of the interface carriers. Thus, it become much easier to inject the electrons from the electron transport layer to the quantum dot light-emitting layer, the charge accumulation at the interface is reduced, and the luminous efficiency and service life of the quantum dot light-emitting device are improved.

As shown in FIG. 2, the cross-linking reaction between the first ligands on the surfaces of the second quantum dots is initiated by the mixed solution of the initiator and the cross-linker, the cross-linking polymerization of the first ligands shortens the distance between quantum dots in the same layer and the distance between quantum dots in different layers, and modifies the grain boundaries in the superlattice, thereby reducing grain boundary defects, improving the crystallinity of the film, finally enhancing the carrier migration ability of the quantum dot film, and reducing the charge accumulation in the quantum dot light-emitting layer and the transport layer of the quantum dot light-emitting device. In addition, the chain polymer formed between the quantum dots of different layers tightly connects the quantum dots, to form a preferred orientation, which provides the basic framework for the crystallization of the quantum dot layer. During the preparation process, the chain polymer is annealed to form the sheet-like crystals, which makes the quantum dot superlattice structure also have a sheet-like superlattice structure. Such a structure has better planar two-dimensional conductivity, that is, the quantum dot film has better in-plane conductivity. On this basis, organic compounds having strong conjugation effects (containing at least one of a fused ring, biphenyl, and at least two continuous double bonds) are used as the third ligands of the quantum dot film, which can increase the affinity between the quantum dot film and the hole transport layer, and the positive surface potential of the fused ring, biphenyl, and the at least two continuous double bonds in the third ligands facilitates hole conduction, thereby promoting carrier conduction and enhancing the interface conductivity with the assistance of the conjugation effect of the third ligands. Meanwhile, due to the poor affinity between the electron transport layer and the chain polymer formed by the polymerization of the double bonds between the first ligands, which affects the film formation of the electron transport layer and the injection of electrons, an organic compound containing at least one of the fused ring, biphenyl, and at least two continuous double bonds is formed at the interface between the electron transport layer and the quantum dot light-emitting layer film. In this way, the charge transport capability in the longitudinal direction of the sheet-like crystals in the quantum dot film is enhanced, the influence of the poor affinity between the chain polymer and the electron transport layer on the film formation and the electron injection effect of the electron transport layer is overcome, the charge accumulation at the interface between the quantum dot film and the electron transport layer is effectively reduced, the charge accumulation of the quantum dot light-emitting device is therefore reduced. Thus, it is solved the problem that the charge is easy to accumulate at the interface and the shell of the quantum dot and the problem that electrons and holes are difficult to meet, and the service life and luminous efficiency of the quantum dot light-emitting device are improved.

Particularly, when the surfaces of the second quantum dots contain both the first ligands and the third ligands, a molar ratio of the third ligands to the first ligands is 0.1-10:1. In such condition, during the crystallization process of quantum dot film, due to the control of the ratio of the amounts of the two ligands in the quantum dots, the superlattice structure of the quantum dots is reorganized during the polymerization reaction, and the quantum dots are embedded in the first ligand polymer chain to form sheet-like superlattice. Since the interface between the quantum dot light-emitting layer and the electron transport layer includes the conjugated ligands, the sheet-like crystals can connect the grain boundary through the conjugated ligands.

It should be understood that in embodiments of the present application, the non-polar solvent adopted may be selected from n-hexane, n-octane, chlorobenzene, but not limited thereto. The polar solvent adopted may be selected from, but be not limited to, any one of anhydrous ethanol, acetic acid ethyl ester, acetone, chloroform, and methanol, but not limited thereto.

Figure 4:
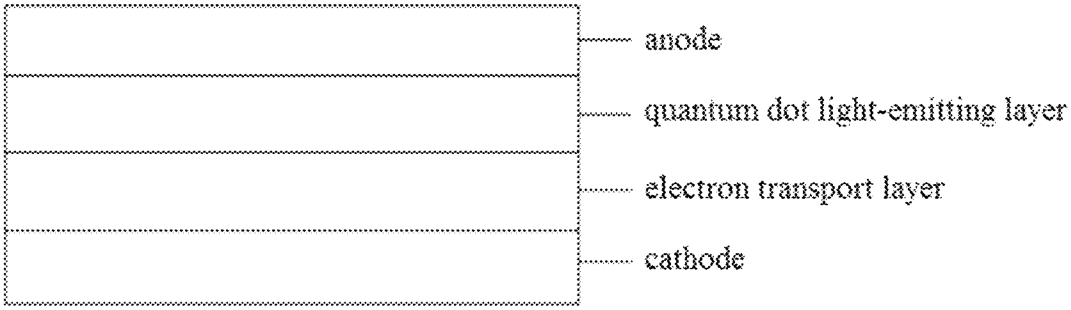
FIG. 4 is a schematic structural diagram of a quantum dot light-emitting diode provided by an embodiment of the present application.

With reference to FIG. 4, a third aspect of embodiments of the present application further provides a quantum dot light-emitting diode. The quantum dot light-emitting diode comprises: an anode and a cathode that are arranged oppositely, and a quantum dot light-emitting layer arranged between the cathode and the anode. The quantum dot light-emitting layer is the quantum dot film as described in the above, or the quantum dot light-emitting layer is the quantum dot film prepared by the method as described in the above.

The quantum dot light-emitting diodes provided in embodiments of the present application use the above-mentioned quantum dot light-emitting film as the quantum dot light-emitting diode, so that the service life and luminous efficiency of the quantum dot light-emitting diodes can be improved, which has great significance for realizing a high-quality multilayer combined film structure.

In some embodiments, the quantum dot light-emitting diode further includes a hole functional layer disposed between the anode and the quantum dot light-emitting layer. The hole functional layer includes at least one of a hole injection layer and the hole transport layer.

In some embodiments, the quantum dot light-emitting diode further includes an electronic functional layer disposed between the cathode and the quantum dot light-emitting layer. The electronic functional layer includes at least one of the electron injection layer and the electron transport layer.

A fourth aspect of embodiments of the present application provides a method for preparing a quantum dot light-emitting diode. The method at least comprises: preparing a quantum dot light-emitting layer. The quantum dot light-emitting layer is prepared by the method as described in the above.

The method for preparing the quantum dot light-emitting diode provided in embodiments of the present application can effectively reduce the non-radiative transition caused by the defects of the crystal grain interface of the quantum dots, shorten the quantum dot spacing, and improve the density of the quantum dot film, thereby improving the radiation transition ability and the carrier mobility of the light emitting layer in the film, and ultimately improving the luminous efficiency and service life of quantum dot light-emitting diode devices.

The following description will be given in conjunction with specific examples.

Example 1

A method for preparing a quantum dot film was performed by the following steps:

A mixed solution of hydroxyethyl methacrylate and n-octanoic acid was added to a non-polar solvent of the quantum dots at room temperature in the presence of an inert gas atmosphere, to form a mixed solution system. After that, the temperature was raised to 150° C., ligand exchange was performed for 30 min to obtain a CdZnSe/ZnSe quantum dot solution having hydroxyethyl methacrylate as the first ligands. After the reaction, a product was repeatedly dissolved by n-hexane and ethanol, precipitated, and centrifuged for several times, and finally the obtained CdZnSe/ZnSe quantum dot product was dispersed in n-octane.

The CdZnSe/ZnSe quantum dots were spin-coated on a substrate to form a quantum dot prefabricated film, and then a layer of ethanol solution containing 5 wt. % AIBN and 2 wt. % EGDMA was spin-coated as a reaction catalyst for the polymerization of the first ligands on the surfaces of the quantum dots at 2500 r/min for 40 s, then a resulting substrate was heated at 70° C. for 24 hrs to obtain quantum dots having surfaces in ordered polymeric structures.

Comparative Example 1

A method for preparing a quantum dot film was performed as follows:

CdZnSe/ZnSe quantum dots having oleic acid as the ligands were spin-coated at room temperature to form quantum dot film.

Example 2

A method for preparing a quantum dot film was performed by the following steps:

A mixed solution of hydroxyethyl methacrylate and n-octanoic acid was added to a non-polar solvent of the quantum dots at room temperature in the presence of an inert gas atmosphere, to form a mixed solution system. After that, the temperature was raised to 120° C., and ligand exchange was performed for 35 min to obtain a CdZnSe/ZnSe/ZnS quantum dot solution having hydroxyethyl methacrylate as the first ligands. After the reaction, a product was repeatedly dissolved by n-hexane and ethanol, precipitated, and centrifuged for several times, and finally the obtained CdZnSe/ZnSe/ZnS quantum dot product was dispersed in n-octane.

The CdZnSe/ZnSe/ZnS quantum dots were spin-coated on a substrate to form a quantum dot prefabricated film, and then a layer of ethanol solution containing 5 wt. % AIBN and 2 wt. % EGDMA was spin-coated as a reaction catalyst for the polymerization of the first ligands on the surfaces of the quantum dots at 3000 r/min for 30 s, then a resulting substrate was heated at 70° C. for 24 hrs to obtain quantum dots having surfaces in ordered polymeric structures.

Comparative Example 2

A method for preparing a quantum dot film was performed as follows:

CdZnSe/ZnSe/ZnS quantum dots having oleic acid as the ligands were spin-coated at room temperature to form quantum dot film.

Example 3

A method for preparing a quantum dot film was performed by the following steps:

A mixed solution of hydroxypropyl methacrylate and n-octanoic acid was added to a non-polar solvent of the quantum dots at room temperature in the presence of an inert gas atmosphere, to form a mixed solution system. After that, the temperature was raised to 180° C., and ligand exchange was performed for 25 min to obtain a CdZnSe/ZnSe/ZnS quantum dot solution having hydroxypropyl methacrylate as the first ligands. After the reaction, a product was repeatedly dissolved by n-hexane and ethanol, precipitated, and centrifuged for several times, and finally the obtained CdZnSe/ZnSe/ZnS quantum dot product was dispersed in n-octane.

The CdZnSe/ZnSe/ZnS quantum dots were spin-coated on a substrate to form a quantum dot prefabricated film, and then a layer of ethanol solution containing 4.6 wt. % AIBN and 2.5 wt. % EGDMA was spin-coated as a reaction catalyst for the polymerization of the first ligands on the surfaces of the quantum dots at 3000 r/min for 30 s, then a resulting substrate was heated at 70° C. for 24 hrs to obtain quantum dots having surfaces in ordered polymeric structures.

Example 4

A method for preparing a quantum dot film was performed by the following steps:

A mixed solution of hydroxypropyl methacrylate and n-octanoic acid was added to a non-polar solvent of the quantum dots at room temperature in the presence of an inert gas atmosphere, to form a mixed solution system. After that, the temperature was raised to 150° C., and ligand exchange was performed for 30 min to obtain a CdZnSe/ZnSe quantum dot solution having hydroxypropyl methacrylate as the first ligands. After the reaction, a product was repeatedly dissolved by n-hexane and ethanol, precipitated, and centrifuged for several times, and finally the obtained CdZnSe/ZnSe quantum dot product was dispersed in n-octane.

The CdZnSe/ZnSe quantum dots were spin-coated on a substrate to form a quantum dot prefabricated film, and then a layer of ethanol solution containing 4.6 wt. % AIBN and 2.5 wt. % EGDMA was spin-coated as a reaction catalyst for the polymerization of the first ligands on the surfaces of the quantum dots at 2000 r/min for 40 s, then a resulting substrate was heated at 70° C. for 24 hrs to obtain quantum dots having surfaces in ordered polymeric structures.

Taking each of the quantum dot films obtained from Examples 1-4 and Comparative Examples 1-2 as the quantum dot light-emitting layer in a quantum dot light-emitting diode, a method for preparing a quantum dot light-emitting diode was performed as follows:

An anode substrate was provided, and the quantum dot light-emitting layer was prepared on the anode substrate according to the method preparing the quantum dot film in Examples 1-4 and Comparative Examples 1-2.

The electron transport layer of nano-zinc oxide was deposited on the quantum dot light-emitting layer, followed by annealing treatment. Then, aluminum electrodes were evaporated and encapsulated with an electronic glue to obtain a quantum dot light-emitting diode.

The quantum dot light-emitting diodes prepared by using the quantum dot films respectively obtained from Examples 1-4 and Comparative Examples 1-2 as the quantum dot light-emitting layers were performed with life performance tests. The test method was conducted as follows: the device was driven by a constant current or voltage, and the time required for the brightness to decrease to a certain proportion of the maximum brightness was tested. Herein, the time required for the brightness to decrease to 95% of the maximum brightness was defined as T95, and the life is the measured life. In order to shorten the test cycle, the device life test is usually carried out by accelerating the aging of the device under high brightness with reference to the OLED device test, and the life under high brightness is obtained by fitting the extended exponential decay brightness decay fitting formula, such as: Lifespan at 1000 nits is defined as T951000 nit. The specific calculation Formula 1 is as follows:

$$T95_L = T95_H \cdot \left(\frac{L_H}{L_L}\right)^A$$

In the formula, $T95_L$ is the lifespan under a low brightness, $T95_H$ is a measured lifespan under a high brightness, $L_H$ is the acceleration of the device to the highest brightness, $L_L$ is 1000 nit, and A is the acceleration factor. For OLED, the value of A is usually 1.6-2. In this experiment, the A value is 1.7 by measuring the lifespan of several groups of green QLED devices at rated brightness.

A life test system was adopted to carry out the life test of the corresponding devices. The test conditions included: room temperature, and 30-60% of the air humidity. The test results are shown in Table 1 below:

TABLE 1

| | Comparative Example 1 | Example 1 | Comparative Example 2 | Example 2 | Example 3 | Example 4 |
|---|---|---|---|---|---|---|
| T95(h) | 1.09 | 1.24 | 0.89 | 1.04 | 1.00 | 1.10 |

Example 5

A CdZnSe/ZnSe quantum dot film having both suberic acid and hydroxyethyl methacrylate as ligands was prepared as follows:

A mixed solution of monomethyl suberate and n-octanoic acid was added to a certain amount of the non-polar solvent of the quantum dots at room temperature in the presence of an inert gas atmosphere, to form a mixed solution system. After that, the temperature was raised to 100° C., ligand exchange was performed for 2 hrs to obtain a quantum dot solution having monomethyl suberate as the ligands. A small amount of a mixed solution of n-octanoic acid and ethanol was added to the quantum dot solution. A resulting solution was then hydrolyzed at 80° C. for 2 hrs to obtain a first quantum dot solution having suberic acid as the main ligands. The mixed solution of hydroxyethyl methacrylate and n-octanoic acid was added to a certain amount of the first quantum dot solution. Then, the temperature was raised to 60° C. to perform the ligand exchange reaction for 16 hrs, and a molar ratio of an addition amount of hydroxyethyl methacrylate to the quantum dots was 50:1, such that a second quantum dot solution having suberic acid and hydroxyethyl methacrylate as the ligands was obtained.

After the reaction, the product was repeatedly dissolved by n-hexane and ethanol, precipitated, and centrifuged for several times, and finally the obtained quantum dot product was dispersed in n-octane.

The ethanol solution containing 5% AIBN and 2% EGDMA was added to the second quantum dot as a reaction catalyst for the polymerization of the ligands of the quantum dots. The second quantum dot solution was spin-coated onto the substrate at 3000 r/min for 30 s. A resulting substrate was heated at 70° C. for 30 min to obtain a polymerized polar quantum dot film.

Example 6

A CdZnSe/ZnSe/ZnS quantum dot film having both adipic acid and hydroxyethyl methacrylate as ligands was prepared as follows:

A mixed solution of monomethyl adipate and n-octanoic acid was added to a certain amount of the non-polar solvent of the quantum dots at room temperature in the presence of an inert gas atmosphere, to form a mixed solution system. After that, the temperature was raised to 100° C., and ligand exchange was performed for 2 hrs to obtain a quantum dot solution having monomethyl adipate as the ligands. A small amount of a mixed solution of n-octanoic acid and ethanol was added to the quantum dot solution. A resulting solution was then hydrolyzed at 80° C. for 2 hrs to obtain a first quantum dot solution having adipic acid as the main ligands. The mixed solution of hydroxyethyl methacrylate and n-octanoic acid was added to a certain amount of the first quantum dot solution. Then, the temperature was raised to 60° C. to perform the ligand exchange reaction for 16 hrs, and a molar ratio of an addition amount of hydroxyethyl methacrylate to the quantum dots was 50:1, such that a second quantum dot solution having adipic acid and hydroxyethyl methacrylate as the ligands was obtained. After the reaction, the product was repeatedly dissolved by n-hexane and ethanol, precipitated, and centrifuged for several times, and finally the obtained quantum dot product was dispersed in n-octane.

The ethanol solution containing 5% AIBN and 2% EGDMA was added to the second quantum dot as a reaction catalyst for the polymerization of the ligands of the quantum dots. The second quantum dot solution was spin-coated onto the substrate at 3000 r/min for 30 s. A resulting substrate was heated at 70° C. for 30 min to obtain a polymerized polar quantum dot film.

Example 7

A CdZnSeS/ZnSe/ZnS quantum dot film having both glutaric acid and hydroxyethyl methacrylate as ligands was prepared as follows:

A mixed solution of monomethyl glutarate and n-octanoic acid was added to a certain amount of the non-polar solvent of the quantum dots at room temperature in the presence of an inert gas atmosphere, to form a mixed solution system. After that, the temperature was raised to 100° C., and ligand exchange was performed for 2 hrs to obtain a quantum dot solution having monomethyl glutarate as the ligands. A small amount of a mixed solution of n-octanoic acid and ethanol was added to the quantum dot solution. A resulting solution was then hydrolyzed at 80° C. for 2 hrs to obtain a first quantum dot solution having glutaric acid as the main ligands. The mixed solution of hydroxyethyl methacrylate and n-octanoic acid was added to a certain amount of the first quantum dot solution. Then, the temperature was raised to 60° C. to perform the ligand exchange reaction for 16 hrs, and a molar ratio of an addition amount of hydroxyethyl methacrylate to the quantum dots was 50:1, such that a second quantum dot solution having glutaric acid and hydroxyethyl methacrylate as the ligands was obtained. After the reaction, the product was repeatedly dissolved by n-hexane and ethanol, precipitated, and centrifuged for several times, and finally the obtained quantum dot product was dispersed in n-octane.

The ethanol solution containing 5% AIBN and 2% EGDMA was added to the second quantum dot as a reaction catalyst for the polymerization of the ligands of the quantum dots. The second quantum dot solution was spin-coated onto the substrate at 3000 r/min for 30 s. A resulting substrate was heated at 70° C. for 30 min to obtain a polymerized polar quantum dot film.

Example 8

A CdZnSeS/ZnS quantum dot film having both sebacic acid and hydroxyethyl methacrylate as ligands was prepared as follows:

A mixed solution of monomethyl sebate and n-octanoic acid was added to a certain amount of the non-polar solvent of the quantum dots at room temperature in the presence of an inert gas atmosphere, to form a mixed solution system. After that, the temperature was raised to 100° C., and ligand exchange was performed for 2 hrs to obtain a quantum dot solution having monomethyl sebate as the ligands. A small amount of a mixed solution of n-octanoic acid and ethanol was added to the quantum dot solution. A resulting solution was then hydrolyzed at 80° C. for 2 hrs to obtain a first quantum dot solution having sebacic acid as the main ligands. The mixed solution of hydroxyethyl methacrylate and n-octanoic acid was added to a certain amount of the first quantum dot solution. Then, the temperature was raised to 60° C. to perform the ligand exchange reaction for 16 hrs, and a molar ratio of an addition amount of hydroxyethyl methacrylate to the quantum dots was 50:1, such that a second quantum dot solution having sebacic acid and hydroxyethyl methacrylate as the ligands was obtained. After the reaction, the product was repeatedly dissolved by n-hexane and ethanol, precipitated, and centrifuged for several times, and finally the obtained quantum dot product was dispersed in n-octane.

The ethanol solution containing 5% AIBN and 2% EGDMA was added to the second quantum dot as a reaction catalyst for the polymerization of the ligands of the quantum dots. The second quantum dot solution was spin-coated onto the substrate at 3000 r/min for 30 s. A resulting substrate was heated at 70° C. for 30 min to obtain a polymerized polar quantum dot film.

Taking each of the quantum dot films obtained from Examples 5-8 as the quantum dot light-emitting layer in a quantum dot light-emitting diode, a method for preparing a quantum dot light-emitting diode was performed as follows:

An anode substrate was provided, and the quantum dot light-emitting layer was prepared on the anode substrate according to the method preparing the quantum dot film in Examples 5-8.

The electron transport layer of nano-zinc oxide was deposited on the quantum dot light-emitting layer, followed by annealing treatment. Then, aluminum electrodes were evaporated and encapsulated with an electronic glue to obtain a quantum dot light-emitting diode.

The quantum dot light-emitting diodes prepared by using the quantum dot films respectively obtained from Examples 5-8 as the quantum dot light-emitting layers were performed with life performance tests. The test method was conducted as follows: the device was driven by a constant current or voltage, and the time required for the brightness to decrease to a certain proportion of the maximum brightness was tested. Herein, the time required for the brightness to decrease to 95% of the maximum brightness was defined as T95, and the life is the measured life. In order to shorten the test cycle, the device life test is usually carried out by accelerating the aging of the device under high brightness with reference to the OLED device test, and the life under high brightness is obtained by fitting the extended exponential decay brightness decay fitting formula, such as: Lifespan at 1000 nits is defined as T951000 nit. The specific calculation Formula 1 is as follows:

$$T95_L = T95_H \cdot \left(\frac{L_H}{L_L}\right)^A$$

In the formula, $T95_L$ is the lifespan under a low brightness, $T95_H$ is a measured lifespan under a high brightness, $L_H$ is the acceleration of the device to the highest brightness, $L_L$ is 1000 nit, and A is the acceleration factor. For OLED, the value of A is usually 1.6-2. In this experiment, the A value is 1.7 by measuring the lifespan of several groups of green QLED devices at rated brightness.

A life test system was adopted to carry out the life test of the corresponding devices. The test conditions included: room temperature, and 30-60% of the air humidity. The test results are shown in Table 2 below:

TABLE 2

| | Example 5 | Example 6 | Example 7 | Example 8 |
|---|---|---|---|---|
| T95(h) | 1.85 | 1.46 | 1.02 | 1.24 |

Example 9

A CdZnSe/ZnSe quantum dot film having both terphenyl-4-carboxylic acid and hydroxyethyl methacrylate as ligands was prepared as follows:

A mixture of hydroxyethyl methacrylate and n-octanoic acid was added to the non-polar solvent of quantum dots at room temperature in the presence of an inert gas atmosphere. A molar ratio of an addition amount of hydroxyethyl methacrylate to the quantum dots was 50:1. After the temperature was raised to 60° C., ligand exchange was performed for 4 hrs to obtain a first quantum dot solution having hydroxyethyl methacrylate as the ligands, in which, hydroxyethyl methacrylate was the first ligands. Then, mixed solution of terphenyl-4-carboxylic acid and n-octanoic acid was added to a certain amount of the first quantum dot solution at room temperature in the presence of an inert gas atmosphere, in which, a molar ratio of the terphenyl-4-carboxylic acid to the quantum dots was 0.5:1. Thereafter, the temperature was raised to 100° C. and the ligand exchange was performed for 16 hrs to obtain a second quantum dot solution having terphenyl-4-carboxylic acid and hydroxyethyl methacrylate as the ligands. After the reaction, a product was repeatedly dissolved by n-hexane and ethanol, precipitated, and centrifuged for several times, and finally the obtained quantum dot product was dispersed in n-octane.

The ethanol solution containing 5% AIBN and 2% EGDMA was added to the second quantum dot as a reaction catalyst for the polymerization of the ligands of the quantum dots. The second quantum dot solution was spin-coated onto the substrate at 3000 r/min for 30 s. A resulting substrate was heated at 70° C. for 30 min to obtain a polymerized quantum dot film having conjugation effect assisting carrier transport.

Example 10

A CdZnSe/ZnSe/ZnS quantum dot film having both 2,4-adipic acid and hydroxyethyl methacrylate as ligands was prepared as follows:

A mixture of hydroxyethyl methacrylate and n-octanoic acid was added to the non-polar solvent of quantum dots at room temperature in the presence of an inert gas atmosphere. A molar ratio of an addition amount of hydroxyethyl methacrylate to the quantum dots was 50:1. After the temperature was raised to 60° C., ligand exchange was performed for 4 hrs to obtain a first quantum dot solution having hydroxyethyl methacrylate as the ligands, in which, hydroxyethyl methacrylate was the first ligands. Then, mixed solution of 2,4-adipic acid and n-octanoic acid was added to a certain amount of the first quantum dot solution at room temperature in the presence of an inert gas atmosphere, in which, a molar ratio of the 2,4-adipic acid to the quantum dots was 0.5:1. Thereafter, the temperature was raised to 100° C. and the ligand exchange was performed for 16 hrs to obtain a second quantum dot solution having 2,4-adipic acid and hydroxyethyl methacrylate as the ligands. After the reaction, a product was repeatedly dissolved by n-hexane and ethanol, precipitated, and centrifuged for several times, and finally the obtained quantum dot product was dispersed in n-octane.

The ethanol solution containing 5% AIBN and 2% EGDMA was added to the second quantum dot as a reaction catalyst for the polymerization of the ligands of the quantum dots. The second quantum dot solution was spin-coated onto the substrate at 3000 r/min for 30 s. A resulting substrate was heated at 70° C. for 30 min to obtain a polymerized quantum dot film having conjugation effect assisting carrier transport.

Example 11

A CdZnSeS/ZnSe/ZnS quantum dot film having both 2-aminoanthracene and hydroxyethyl methacrylate as ligands was prepared as follows:

A mixture of hydroxyethyl methacrylate and n-octanoic acid was added to the non-polar solvent of quantum dots at room temperature in the presence of an inert gas atmosphere. A molar ratio of an addition amount of hydroxyethyl methacrylate to the quantum dots was 50:1. After the temperature was raised to 60° C., ligand exchange was performed for 4 hrs to obtain a first quantum dot solution having hydroxyethyl methacrylate as the ligands, in which, hydroxyethyl methacrylate was the first ligands. Then, a mixed solution of 2-aminoanthracene and n-octanoic acid was added to a certain amount of the first quantum dot solution at room temperature in the presence of an inert gas atmosphere, in which, a molar ratio of the 2-aminoanthracene to the quantum dots was 0.5:1. Thereafter, the temperature was raised to 100° C. and the ligand exchange was performed for 16 hrs to obtain a second quantum dot solution having 2-aminoanthracene and hydroxyethyl methacrylate as the ligands. After the reaction, a product was repeatedly dissolved by n-hexane and ethanol, precipitated, and centrifuged for several times, and finally the obtained quantum dot product was dispersed in n-octane.

The ethanol solution containing 5% AIBN and 2% EGDMA was added to the second quantum dot as a reaction catalyst for the polymerization of the ligands of the quantum dots. The second quantum dot solution was spin-coated onto the substrate at 3000 r/min for 30 s. A resulting substrate was heated at 70° C. for 30 min to obtain a polymerized quantum dot film having conjugation effect assisting carrier transport.

Example 12

A CdZnSeS/ZnS quantum dot film having both 2-naphthylamine and hydroxyethyl methacrylate as ligands was prepared as follows:

A mixture of hydroxyethyl methacrylate and n-octanoic acid was added to the non-polar solvent of quantum dots at room temperature in the presence of an inert gas atmosphere. A molar ratio of an addition amount of hydroxyethyl methacrylate to the quantum dots was 50:1. After the temperature was raised to 60° C., ligand exchange was performed for 4 hrs to obtain a first quantum dot solution having hydroxyethyl methacrylate as the ligands, in which, hydroxyethyl methacrylate was the first ligands. Then, a mixed solution of 2-naphthylamine and n-octanoic acid was added to a certain amount of the first quantum dot solution at room temperature in the presence of an inert gas atmosphere, in which, a molar ratio of the 2-naphthylamine to the quantum dots was 0.5:1. Thereafter, the temperature was raised to 100° C. and the ligand exchange was performed for 16 hrs to obtain a second quantum dot solution having 2-naphthylamine and hydroxyethyl methacrylate as the ligands. After the reaction, a product was repeatedly dissolved by n-hexane and ethanol, precipitated, and centrifuged for several times, and finally the obtained quantum dot product was dispersed in n-octane.

The ethanol solution containing 5% AIBN and 2% EGDMA was added to the second quantum dot as a reaction catalyst for the polymerization of the ligands of the quantum dots. The second quantum dot solution was spin-coated onto the substrate at 3000 r/min for 30 s. A resulting substrate was heated at 70° C. for 30 min to obtain a polymerized quantum dot film having conjugation effect assisting carrier transport.

Taking each of the quantum dot films obtained from Examples 9-12 as the quantum dot light-emitting layer in a quantum dot light-emitting diode, a method for preparing a quantum dot light-emitting diode was performed as follows:

An anode substrate was provided, and the quantum dot light-emitting layer was prepared on the anode substrate according to the method preparing the quantum dot film in Examples 9-12.

The electron transport layer of nano-zinc oxide was deposited on the quantum dot light-emitting layer, followed by annealing treatment. Then, aluminum electrodes were evaporated and encapsulated with an electronic glue to obtain a quantum dot light-emitting diode.

The quantum dot light-emitting diodes prepared by using the quantum dot films respectively obtained from Examples 9-12 as the quantum dot light-emitting layers were performed with life performance tests. The test method was conducted as follows: the device was driven by a constant current or voltage, and the time required for the brightness to decrease to a certain proportion of the maximum brightness was tested. Herein, the time required for the brightness to decrease to 95% of the maximum brightness was defined as T95, and the life is the measured life. In order to shorten the test cycle, the device life test is usually carried out by accelerating the aging of the device under high brightness with reference to the OLED device test, and the life under high brightness is obtained by fitting the extended exponential decay brightness decay fitting formula, such as: Lifespan at 1000 nits is defined as T951000 nit. The specific calculation Formula 1 is as follows:

$$T95_L = T95_H \cdot \left(\frac{L_H}{L_L}\right)^A$$

In the formula, $T95_L$ is the lifespan under a low brightness, $T95_H$ is a measured lifespan under a high brightness, $L_H$ is the acceleration of the device to the highest brightness, $L_L$ is 1000 nit, and A is the acceleration factor. For OLED, the value of A is usually 1.6-2. In this experiment, the A value is 1.7 by measuring the lifespan of several groups of green QLED devices at rated brightness.

A life test system was adopted to carry out the life test of the corresponding devices. The test conditions included: room temperature, and 30-60% of the air humidity. The test results are shown in Table 3 below:

TABLE 3

| | Example 9 | Example 10 | Example 11 | Example 12 |
|---|---|---|---|---|
| T95(h) | 2.10 | 1.71 | 1.42 | 1.13 |

The above are only optional embodiments of the present application, and are not intended to limit the present application. Various modifications and variations of the present application are possible for those skilled in the art. Any modification, equivalent replacement, and improvement made within the spirit and principle of the present application shall be included within the scope of the claims of the present application.

What is claimed is:

1. A method for preparing a quantum dot film, comprising the following steps:

in the presence of an inert gas atmosphere, providing a mixed solution system comprising first quantum dots and a fatty acid solution of first ligands, and performing ligand exchange reaction under a first heating condition, to prepare second quantum dots having the first ligands attached to surfaces thereof; wherein each of the first ligands has a structure formula as represented by Formula 1, Formula 1

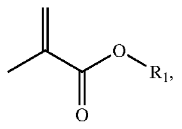

in which, $R_1$ is selected from a substitute containing between one and six carbon atoms and having a first active group at a terminal; and providing a substrate, depositing the second quantum dots on the substrate to prepare a quantum dot prefabricated film, depositing a mixed solution containing an initiator and a cross-linker on the quantum dot prefabricated film, and heating to crosslink the first ligands on the surfaces of the second quantum dots, to obtain the quantum dot film; or alternatively, providing a substrate, adding an initiator and a cross-linker to the second quantum dots, and depositing a resulting mixed system onto the substrate, heating to crosslink the first ligands on the surfaces of the second quantum dots, to obtain the quantum dot film.

2. The method for preparing the quantum dot film according to claim 1, wherein the first active group is at least one selected from the group consisting of carboxyl, hydroxyl, amino, and sulfhydryl; and/or the first ligands are at least one selected from the group consisting of hydroxyethyl methacrylate, hydroxypropyl methacrylate, and hydroxybutyl methacrylate; and/or the initiator is at least one selected from the group consisting of azobisisobutyronitrile and benzoyl peroxide; and/or the cross-linker is at least one selected from the group consisting of ethylene glycol dimethacrylate and divinylbenzene.

3. The method for preparing the quantum dot film according to claim 1, wherein after the step of performing the ligand exchange reaction under the first heating condition, the method further comprises: dispersing a resulting reaction system in a polar solvent, collecting a quantum dot precipitate, dissolving the quantum dot precipitate into a nonpolar solvent, and repeating these operations for at least one time; and/or the step of heating to crosslink the first ligands on the surfaces of the second quantum dots is performed at a temperature of between 6° and 90° C. for a reaction duration of between 24 and 48 hrs; and/or a fatty acid in the fatty acid solution of the first ligands is at least one selected from n-octanoic acid, acetic acid, n-hexanoic acid, n-butyric acid, and n-valeric acid.

4. The method for preparing the quantum dot film according to claim 1, wherein in the mixed solution system comprising the first quantum dots and the fatty acid solution of the first ligands, a molar ratio of the first ligands to the first quantum dots is 50-100:1; and/or in the step of performing the ligand exchange reaction under the first heating condition, the first heating condition comprises a temperature of between 10° and 200° C., and a duration for the ligand exchange reaction is between 20 and 40 min.

5. The method for preparing the quantum dot film according to claim 1, wherein the step of providing the mixed solution system comprising the first quantum dots and the fatty acid solution of the first ligands comprises: preparing the fatty acid solution of the first ligands and a nonpolar solution of the first quantum dots, respectively, and mixing the two to obtain the mixed solution system.

6. The method for preparing the quantum dot film according to claim 1, wherein the first quantum dots are quantum dots having second ligands attached to surfaces thereof; and the second quantum dots are quantum dots having both the first ligands and the second ligands attached to surfaces thereof;

each of the second ligands has a structure formula as represented by Formula 2, in which, $X_1$ is a second active group configured to bind with the quantum dots, $R_2$ is $-(CH_2)_n-$, n is a positive integer, and n ranges between 1 and 10;

Formula 2

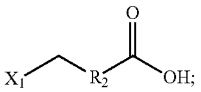

the first quantum dots are prepared as follows:

in the presence of an inert gas atmosphere, providing original quantum dots and a fatty acid solution of a compound A, and mixing the original quantum dots and the fatty acid solution of the compound A to form a mixed solution system, performing ligand exchange reaction under a second heating condition to prepare quantum dots having the compound A attached to surfaces thereof; wherein the compound A has a structure formula as follows:

Compound A

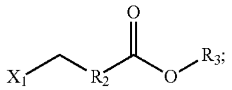

in which, $X_1$ is a second active group configured to bind with one of the quantum dots, $R_2$ is $-(CH_2)_n-$, $R_3$ is a straight chain $C_mH_{2m+1}$, m and n are positive integers, and m+n ranges between 2 and 12; and hydrolyzing the compound A on the surfaces of the quantum dots whereby obtaining the first quantum dots having the second ligands attached to the surfaces thereof.

7. The method for preparing the quantum dot film according to claim 6, wherein the second active group is one selected from the group consisting of carboxyl, hydroxyl, amino, and sulfhydryl; and/or the compound A is at least one selected from monomethyl suberate, monoethyl heptandilate, and monoethyl azelaate.

8. The method for preparing the quantum dot film according to claim 6, wherein in the mixed solution system comprising the original quantum dots and the fatty acid solution of the compound A, a molar ratio of the compound A to the original quantum dots is 50-100:1; and in the step of providing the mixed solution system comprising the first quantum dots and the fatty acid solution of the first ligands, the mixed solution system is prepared according to a molar ratio of the compound A to the first ligands of between 1:1 and 3:1; and/or in the step of performing ligand exchange reaction under the second heating condition, the second heating condition comprises a temperature of between 10° and 200° C. and a duration for the ligand exchange reaction is between 2 and 4 hrs; and in the step performing ligand exchange reaction under a first heating condition, the first heating condition comprises a temperature of between 6° and 90° C. and a duration for the ligand exchange reaction is between 4 and 14 hrs; and/or a fatty acid in the fatty acid solution of the compound A is at least one selected from n-octanoic acid, acetic acid, n-hexanoic acid, n-butyric acid, and n-valeric acid.

9. The method for preparing the quantum dot film according to claim 6, wherein the step of providing the mixed solution system comprising the first quantum dots and the fatty acid solution of the first ligands comprises: preparing a fatty acid solvent of the compound A and a nonpolar solution of the original quantum dots, respectively, and mixing the same to obtain the mixed solution system.

10. The method for preparing the quantum dot film according to claim 6, wherein third ligands are further attached to the surfaces of the second quantum dots, wherein each of the third ligands is a conjugated organic compound containing at least one selected from the group consisting of a fused ring, biphenyl, and $—(CH═CH—CH═CH)_n—$, n represents an integer between 1 and 10, the third ligand contains a third active group, and a polarity of the third active group is greater than a polarity of the first active group;

the step of attaching the third ligands to the surfaces of the second quantum dots comprises:

in the presence of the inert gas atmosphere, providing the second quantum dots and a fatty acid solution of the third ligands; mixing the second quantum dots and the fatty acid solution of the third ligands to form a mixed solution system, performing ligand exchange reaction under a third heating condition, to prepare quantum dots having both the first ligands and the third ligands attached to surfaces thereof.

11. The method for preparing the quantum dot film according to claim 10, wherein in the mixed solution system comprising the second quantum dots and the fatty acid solution of the third ligands, a molar ratio of the third ligands to the second quantum dots is 0.5-5:1; and/or in the step of performing the ligand exchange reaction under the third heating condition, the third heating condition comprises a temperature of between 8° and 120° C., and a duration of the ligand exchange reaction is between 8 and 16 hrs; and in the step performing the ligand exchange reaction under the first heating condition, the first heating condition comprises a temperature of between 10° and 200° C. and a duration for the ligand exchange reaction is between 2 and 4 hrs; and/or a fatty acid in the fatty acid solution of the third ligands is at least one selected from the group consisting of n-octanoic acid, acetic acid, n-hexanoic acid, n-butyric acid, and n-valeric acid.

12. The method for preparing the quantum dot film according to claim 10, wherein the step of mixing the second quantum dots and the fatty acid solution of the third ligands to form the mixed solution system comprises: preparing a fatty acid solvent of the third ligands and a solution of the second quantum dots, respectively, and mixing the same to obtain the mixed solution system.

13. The method for preparing the quantum dot film according to claim 10, wherein the third active group is one selected from the group consisting of carboxyl, hydroxyl, amino, and sulfhydryl; and/or the third ligands are at least one selected from Formula 3, Formula 4, and Formula 5;

Formula 3

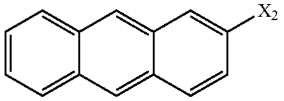

Formula 4

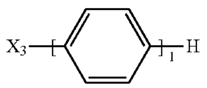

Formula 5

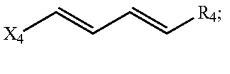

in which, $X_2$, $X_3$, and $X_4$ are independently and respectively selected from the third active group attached with the quantum dots; 1 represents a positive integer between 1 and 6; and $R_4$ is selected from alkenyl or alkyl having between 1 and 20 carbon atoms.

14. The method for preparing the quantum dot film according to claim 13, wherein the third ligands are at least one selected from the group consisting of terphenyl-4-carboxylic acid, 1,1',4',1"-terphenyl-4-thiol, 2,4-hexadienoic acid, trans, trans-2,4-hexadien-1-ol, 2-anthracenecarboxylic acid, and 2-aminoanthracene.

15. A quantum dot film, composed of quantum dots, each of the quantum dots comprising a quantum dot matrix and ligands attached to a surface of the quantum dot matrix; wherein each of the ligands comprises a first ligand having a structure formula as represented by Formula 1, Formula 1

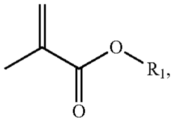

in which, $R_1$ is selected from a substitute containing between one and six carbon atoms and having a first active group at a terminal; and the first ligands are crosslinked with one another via polymerization reaction of double bonds to form a network structure; and second ligands are further attached to the surfaces of the quantum dots, and each of the second ligands is a compound having a structure represented by Formula 2:

Formula 2

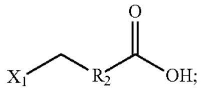

in which, $X_1$ represents the second active group attached to the quantum dots; $R_2$ represents $—(CH_2)_n—$, n represents an integer, and n ranges between 1 and 10.

16. The quantum dot film according to claim 15, wherein the first active group is at least one selected from carboxyl, hydroxyl, amino, and sulfhydryl; and/or the first ligands are at least one selected from the group consisting of hydroxyethyl methacrylate, hydroxypropyl methacrylate, and hydroxybutyl methacrylate.

17. The quantum dot film according to claim 15, wherein a molar ratio of the second ligands to the first ligands is 1:1-3:1; and/or the second active group is one selected from the group consisting of carboxyl, hydroxyl, amino, and sulfhydryl; and/or the second ligands are at least one selected from the group consisting of suberic acid, pimelic acid, and azelaic acid.

18. The quantum dot film according to claim 15, wherein third ligands are further attached to the surfaces of the quantum dots, and the third ligands are compounds containing at least one of a fused ring, biphenyl, and at least two continuous double bonds, and the third active group; and/or a molar ratio of the third ligands to the quantum dot matrixes is 0.5-5:1; and/or the third active group is one selected from carboxyl, hydroxyl, amino, and sulfhydryl; and/or the third ligands are at least one selected from Formula 3, Formula 4, and Formula 5;

Formula 3

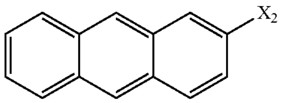

Formula 4

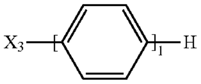

Formula 5

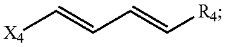

in which, $X_2$, $X_3$, and $X_4$ are independently and respectively selected from the third active group attached with the quantum dots; 1 represents a positive integer between 1 and 6; and $R_4$ is selected from alkenyl or alkyl having between 1 and 20 carbon atoms.

19. A quantum dot light-emitting diode, comprising:

an anode and a cathode that are arranged oppositely, and a quantum dot light-emitting layer arranged between the cathode and the anode; wherein the quantum dot light-emitting layer is a quantum dot film composed of quantum dots; each of the quantum dots comprises a quantum dot matrix and ligands attached to a surface of the quantum dot matrix;

each of the ligands comprises a first ligand having a structure formula as represented by Formula 1, Formula 1

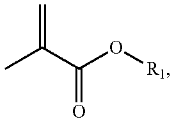

in which, $R_1$ is selected from a substitute containing between one and six carbon atoms and having a first active group at a terminal; and the first ligands are crosslinked with one another via polymerization reaction of double bonds to form a network structure; and second ligands are further attached to the surfaces of the quantum dots, and each of the second ligands is a compound having a structure represented by Formula 2:

Formula 2

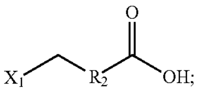

in which, $X_1$ represents the second active group attached to the quantum dots; $R_2$ represents $-(CH_2)_n-$, n represents an integer, and n ranges between 1 and 10.

* * * * *